(12) United States Patent
Lai et al.

(10) Patent No.: US 10,847,505 B2
(45) Date of Patent: Nov. 24, 2020

(54) MULTI-CHIP SEMICONDUCTOR PACKAGE

(71) Applicant: Taiwan Semiconductor Manufacturing Company, Ltd., Hsinchu (TW)

(72) Inventors: Yu-Chia Lai, Zhunan Township (TW); Kuo Lung Pan, Hsinchu (TW); Hung-Yi Kuo, Taipei (TW); Tin-Hao Kuo, Hsinchu (TW); Hao-Yi Tsai, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/128,034

(22) Filed: Sep. 11, 2018

(65) Prior Publication Data

US 2019/0312018 A1 Oct. 10, 2019

Related U.S. Application Data

(60) Provisional application No. 62/655,690, filed on Apr. 10, 2018.

(51) Int. Cl.
*H01L 25/18* (2006.01)
*H01L 23/00* (2006.01)
(Continued)

(52) U.S. Cl.
CPC ............. *H01L 25/18* (2013.01); *H01L 23/24* (2013.01); *H01L 24/03* (2013.01); *H01L 24/06* (2013.01);
(Continued)

(58) Field of Classification Search
CPC ......... H01L 25/18; H01L 25/50; H01L 24/03; H01L 24/06; H01L 24/11; H01L 24/13;
(Continued)

(56) References Cited

U.S. PATENT DOCUMENTS

| 2009/0001542 A1* | 1/2009 | Kim ................. H01L 23/3128 257/686 |
| 2009/0085222 A1 | 4/2009 | Yamano |

(Continued)

FOREIGN PATENT DOCUMENTS

| CN | 101399256 A | 4/2009 |
| CN | 106558565 A | 4/2017 |

(Continued)

*Primary Examiner* — Patricia D Reddington
(74) *Attorney, Agent, or Firm* — Slater Matsil, LLP

(57) ABSTRACT

A semiconductor package includes a first die; a first redistribution structure over the first die, the first redistribution structure being conterminous with the first die; a second die over the first die, a first portion of the first die extending beyond a lateral extent of the second die; a conductive pillar over the first portion of the first die and laterally adjacent to the second die, the conductive pillar electrically coupled to first die; a molding material around the first die, the second die, and the conductive pillar; and a second redistribution structure over the molding material, the second redistribution structure electrically coupled to the conductive pillar and the second die.

20 Claims, 22 Drawing Sheets

(51) Int. Cl.
*H01L 25/00* (2006.01)
*H01L 23/24* (2006.01)

(52) U.S. Cl.
CPC .............. *H01L 24/11* (2013.01); *H01L 24/13* (2013.01); *H01L 24/24* (2013.01); *H01L 24/73* (2013.01); *H01L 24/82* (2013.01); *H01L 25/50* (2013.01); *H01L 2224/02311* (2013.01); *H01L 2224/02373* (2013.01); *H01L 2224/02375* (2013.01); *H01L 2224/02377* (2013.01); *H01L 2224/06155* (2013.01); *H01L 2224/11462* (2013.01); *H01L 2224/11464* (2013.01); *H01L 2224/13024* (2013.01); *H01L 2224/24101* (2013.01); *H01L 2224/24147* (2013.01); *H01L 2224/32147* (2013.01); *H01L 2224/73209* (2013.01); *H01L 2224/73267* (2013.01); *H01L 2924/14* (2013.01); *H01L 2924/181* (2013.01)

(58) Field of Classification Search
CPC ......... H01L 24/82; H01L 24/24; H01L 24/73; H01L 24/19; H01L 24/20; H01L 23/24; H01L 23/5383; H01L 23/49816; H01L 23/5389; H01L 2224/73267; H01L 2224/02311; H01L 2224/02377; H01L 2224/02375; H01L 2224/02373; H01L 2224/06155; H01L 2224/11462; H01L 2224/11464; H01L 2224/13024; H01L 2224/24101; H01L 2224/24147; H01L 2224/32147; H01L 2224/73209; H01L 2224/04105; H01L 2224/12105; H01L 2224/9224; H01L 2224/214; H01L 2224/32225; H01L 2224/32145; H01L 2924/181; H01L 2924/14

See application file for complete search history.

(56) References Cited

U.S. PATENT DOCUMENTS

| | | | |
|---|---|---|---|
| 2012/0056316 A1* | 3/2012 | Pagaila | H01L 24/96 257/737 |
| 2016/0071810 A1 | 3/2016 | Park | |
| 2017/0133351 A1 | 5/2017 | Su et al. | |
| 2017/0207197 A1 | 7/2017 | Yu et al. | |
| 2017/0301649 A1 | 10/2017 | Wu et al. | |
| 2018/0040575 A1 | 2/2018 | Lin | |
| 2018/0053746 A1 | 2/2018 | Yu et al. | |
| 2018/0122764 A1 | 5/2018 | Chen et al. | |

FOREIGN PATENT DOCUMENTS

| | | |
|---|---|---|
| CN | 107768351 A | 3/2018 |
| CN | 107845625 A | 3/2018 |
| TW | 201730989 A | 9/2017 |
| TW | 201737432 A | 10/2017 |
| TW | 201806106 A | 2/2018 |

* cited by examiner

MULTI-CHIP SEMICONDUCTOR PACKAGE

PRIORITY CLAIM AND CROSS-REFERENCE

This application claims priority to U.S. Provisional Patent Application No. 62/655,690, filed Apr. 10, 2018, entitled "Multi-Chip Semiconductor Package," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies further advance, stacked semiconductor devices, e.g., 3D integrated circuit (3DIC) packages, have emerged as an effective alternative to further reduce the physical size of a semiconductor device. In a stacked semiconductor device, active circuits such as logic, memory, processor circuits and the like are fabricated on different semiconductor wafers. Two or more semiconductor components may be installed on top of one another to further reduce the form factor of the semiconductor device.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor device. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a first redistribution structure is formed over and electrically coupled to a first die. The redistribution layer of the first redistribution structure re-routes electrical connections to I/O pads of the first die from first locations to second locations, such as within an area of the redistribution layer having pad regions. Conductive pillars are formed over and electrically coupled to the pad regions. The backside of the first die is then attached to a carrier. An optional second die, which may be a dummy die, is attached to the carrier adjacent to the first die. Next, a third die is attached to the upper surface of the first die, and attached to the upper surface of the second die (if formed). Next, a molding material is formed over the carrier and around the first die, the second die, the third die, and the conductive pillar. After the molding material is formed, a second redistribution structure is formed over the molding material and is electrically coupled to the third die and the conductive pillar.

Figure 1A:
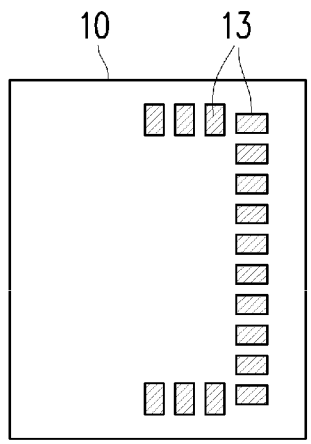
FIGS. 1A and 1B illustrate the layouts of the input/output (I/O) pads of various semiconductor dies, in some embodiments.

FIG. 1A illustrates the layout of the input/output (I/O) pads 13 of a semiconductor die 10, in some embodiments. The semiconductor die 10 may be a memory die and may be stacked with another die to form a 3DIC package. In the top view illustrated in FIG. 1A, the I/O pads 13 of the semiconductor die 10 are disposed along the edges (e.g., perimeters, or sidewalls) of the semiconductor die 10 and form a U-shape. In the discussion herein, a semiconductor die may also be referred to as a die, or an integrated circuit (IC) die.

Figure 1B:
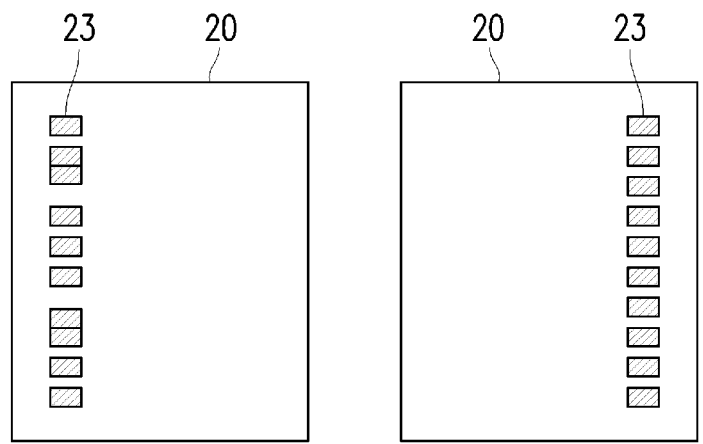

FIG. 1B illustrates the layout of the I/O pads 23 of two semiconductor dies 20 (e.g., memory dies), in some embodiments. The I/O pads 23 of each of the semiconductor dies 20 in FIG. 1B are formed along a line and are disposed along an edge (e.g., a perimeter, or a sidewall) of a respective semiconductor die 20. The semiconductor dies 20 may be memory dies and may be coupled with another die to form a 3DIC package.

In some embodiments, a signal processing die is stacked over one or more memories dies (e.g., 10 or 20) to form a semiconductor device (e.g., a 3DIC package). The signal processing die may be, e.g., a base-band die used for wireless communication, and may include a micro-controller, a central processing unit (CPU), a digital signal processor (DSP), and may include I/O peripherals and additional hardware blocks such as Fast Fourier-Transform (FFT) blocks, filter, digital equalizers, and the like to perform various design functionalities. In some applications, the signal processing die and the memory dies that are integrated together in the 3DIC package are manufactured by different manufacturers, and the locations of the I/O pads of the memories dies may not be conducive to vertical stacking of the signal processing die over the memory dies. The various embodiments disclosed herein provide structures and methods that are able to accommodate integration of dies with different I/O pad locations.

Figure 2:
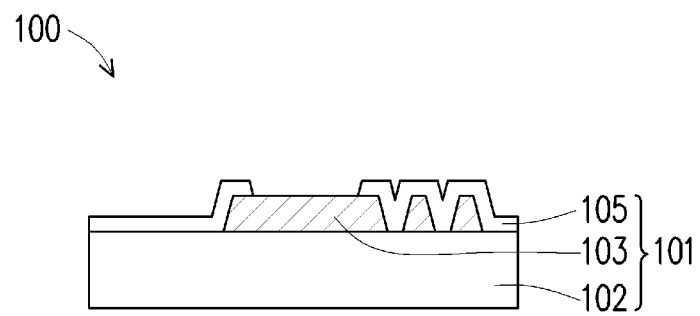
FIGS. 2-10, 11A, and 11B illustrate various cross-sectional views of a semiconductor device at various stages of fabrication, in accordance with an embodiment.

FIGS. 2-10, 11A, and 11B illustrate various cross-sectional views of a semiconductor device 100 (e.g., a 3DIC semiconductor package) at various stages of fabrication, in accordance with an embodiment. FIG. 2 shows the cross-sectional view of a die 101, which may be a memory die, such as a dynamic random access memory (DRAM) die. Only one semiconductor die 101 is illustrated in FIG. 2 (and subsequent figures) for simplicity, however, it is understood that tens of, hundreds of, or even more semiconductor dies may be formed simultaneously on a single substrate during semiconductor manufacturing, and may be singulated later to form a plurality of individual devices.

In some embodiments, the semiconductor die 101 includes a semiconductor substrate 102, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 102 and may be interconnected by interconnect structures formed by, for example, metallization patterns in one or more dielectric layers over the semiconductor substrate 102 to form an integrated circuit.

The die 101 further comprises pads 103 (may also be referred to as bond pads), such as aluminum pads, to which external connections are made. The pads 103 are on what may be referred to as the active side (or the front side) of the integrated circuit dies 101. A passivation film 105 is formed at the active side of the integrated circuit die 101 and on portions of the pads 103. As illustrated in FIG. 2, openings are formed in the passivation film 105 to expose the pads 103. The pads 103 may correspond to the I/O pads 13 in FIG. 1A, or the I/O pads 23 in FIG. 1B.

Figure 3:
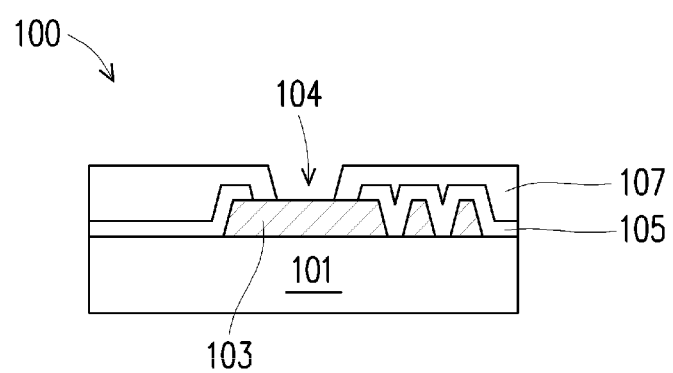
Figure 4:
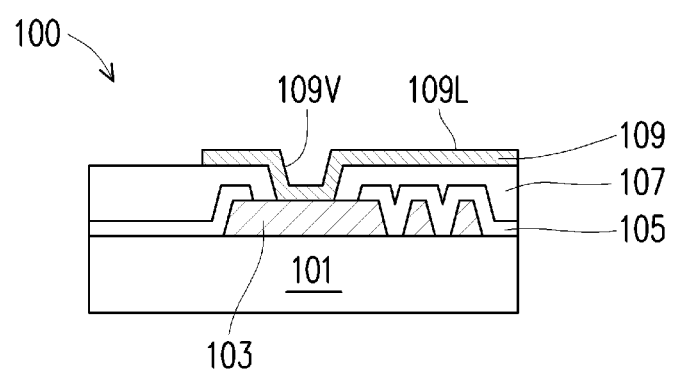
Figure 5:
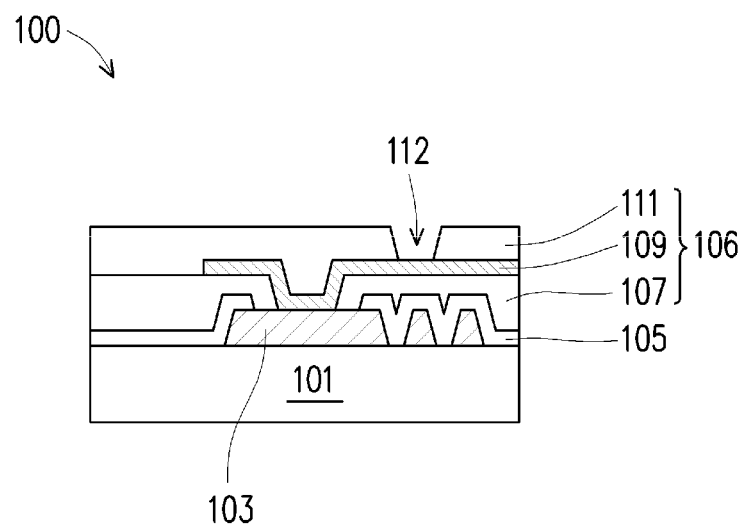

FIGS. 3-5 illustrate the formation of a redistribution structure 106 (see label in FIG. 5) over the die 101. Referring to FIG. 3, a dielectric layer 107 is formed over the die 101. The dielectric layer 107 is on the active side of the integrated circuit die 101, such as on the passivation films 105 and the pads 103. The dielectric layer 107 is laterally coterminous with the integrated circuit die 101. The dielectric layer 107 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, chemical vapor deposition (CVD), or the like. Openings 104 are formed in the dielectric layer 107 to expose the pads 103. The openings 104 may be formed used photolithography and etching techniques.

Next, in FIG. 4, a redistribution layer (RDL) 109 is formed over the dielectric layer 107. The RDL 109 may be formed of an electrically conductive material (e.g., copper) and may include conductive features such as vias and conductive lines. The RDL 109 may be formed by, e.g., forming a seed layer over the dielectric layer 107 and in the openings 104, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. Other methods for forming the RDL 109 are possible and are fully intended to be included within the scope of the present disclosure. As illustrated in FIG. 4, the RDL 109 may include vias 109V that are over and coupled to the pads 103, and may also include conductive lines 109L that are coupled to the vias 109V and extends substantially parallel to an upper surface of the substrate 102. In some embodiments, the RDL 109 includes pad regions 109P (see FIGS. 6 and 11B) for coupling to subsequently formed conductive pillars 113 (see FIG. 6).

Next, in FIG. 5, a dielectric layer 111 is formed over the dielectric layer 107 and over the RDL 109. The dielectric layer 111 may be formed of a same or a similar material as the dielectric layer 107 using a same or a similar formation method, details are thus not repeated. The dielectric layer 111, the RDL 109 and the dielectric layer 107 form the redistribution structure 106 of FIG. 5. Since the redistribution structure 106 re-routes the electrical connections of the die 101 to different locations within the boundaries (e.g., perimeters, or sidewalls) of the die 101, the redistribution structure 106 is also referred to as a fan-in redistribution structure, in some embodiments. Next, openings 112 are formed in the dielectric layer 111 to expose portions of the RDL 109, in the illustrated embodiment.

Figure 6:
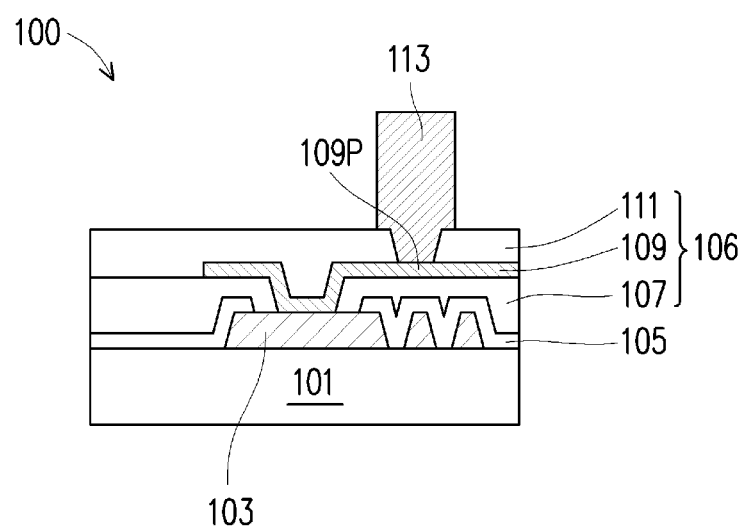

Referring next to FIG. 6, conductive pillars 113 (e.g., copper pillars) are formed over the portions (e.g., the pad regions 109P) of the RDL 109 exposed by the openings 112, and are electrically coupled to the RDL 109 and to the die 101. The conductive pillars 113 may be formed by, e.g., forming a seed layer over the dielectric layer 111 and in the openings 112, forming a patterned photoresist with a designed pattern over the seed layer, plating (e.g., electroplating or electroless plating) a conductive material (e.g., copper) in the designed pattern and over the seed layer, and removing the photoresist and portions of seed layer on which the conductive material is not formed. Other methods for forming the conductive pillars 113 are possible and are fully intended to be included within the scope of the present disclosure.

After the conductive pillars 113 are formed, a thinning process is performed using, e.g., a grinding process, to reduce a thickness of the semiconductor die 101, in some embodiments. In some embodiments, a thick dicing tape (e.g., thicker than a height of the conductive pillar 113) is used to attach the conductive pillar 113 and the die 101 for the thinning process, such that the conductive pillars 113 sink into the thick dicing tape during the thinning process. The grinding process may remove portions of the semiconductor substrate 102 from the backside of the semiconductor die 101.

Figure 7:
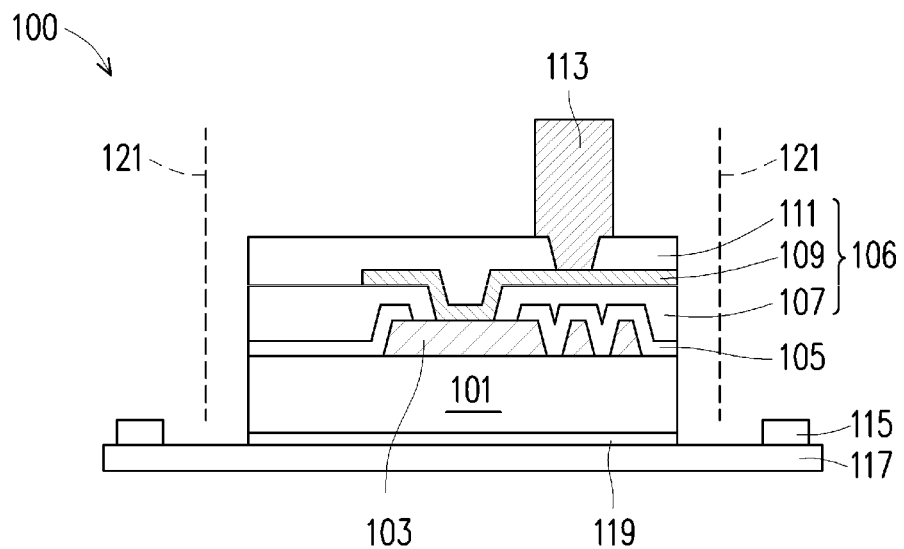

Next, in FIG. 7, the semiconductor device 100 of FIG. 6 is attached to a tape 117 (e.g., a dicing tape) supported by a frame 115. An adhesive layer 119, e.g., a die attaching film (DAF), may be used to attach the semiconductor device 100 to the tape 117. Next, a dicing process is performed using, e.g., a dicing blade, a laser, or the like, along dicing lines 121, to separate the semiconductor device 100 from neighboring semiconductor devices 100 formed on the same substrate, thus forming a plurality of individual semiconductor devices 100. An optional cleaning process, such as a scrubber cleaning process, may be performed after the dicing process to rinse off residues produced by the dicing process from the semiconductor device 100. As illustrated in FIG. 7, after the dicing process, the redistribution structure 106 is conterminous with the die 101. In other words, sidewalls of the redistribution structure 106 are aligned with sidewalls of the die 101.

Figure 8:
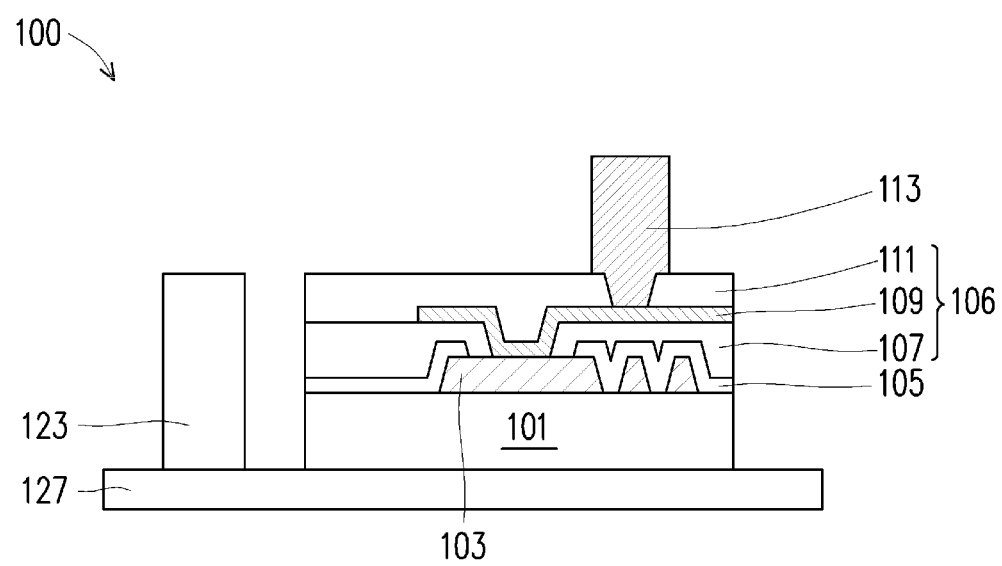

Next, in FIG. 8, the semiconductor device 100 is removed from the tape 117, and is attached to a carrier 127. The carrier 127 may be made of a material such as silicon, polymer, polymer composite, metal foil, ceramic, glass, glass epoxy, beryllium oxide, tape, or other suitable material for structural support. An adhesive layer, such as a DAF, may be used to attach the semiconductor device 100 to the carrier 127. In addition, a die 123 is also attached to the carrier 127 and adjacent to the die 101. An adhesive layer such as DAF may be used to attach the die 123 to the carrier 127.

In some embodiments, the die 123 is a dummy die (e.g., a die that does not have a functional circuit), and the dummy die is used to provide mechanical support for a subsequently attached die 131 (see FIG. 9). The dummy die may be made of, e.g., a semiconductor material such as a bulk piece of silicon, although other suitable material, such as glass or aluminum nitride (AlN), may also be used. An upper surface of the die 123 may be level with an upper surface of the dielectric layer 111. In other embodiments, the die 123 is another memory die (see, e.g., FIG. 21A). For example, the die 123 may be of a same type of memory die as the die 101.

Figure 9:
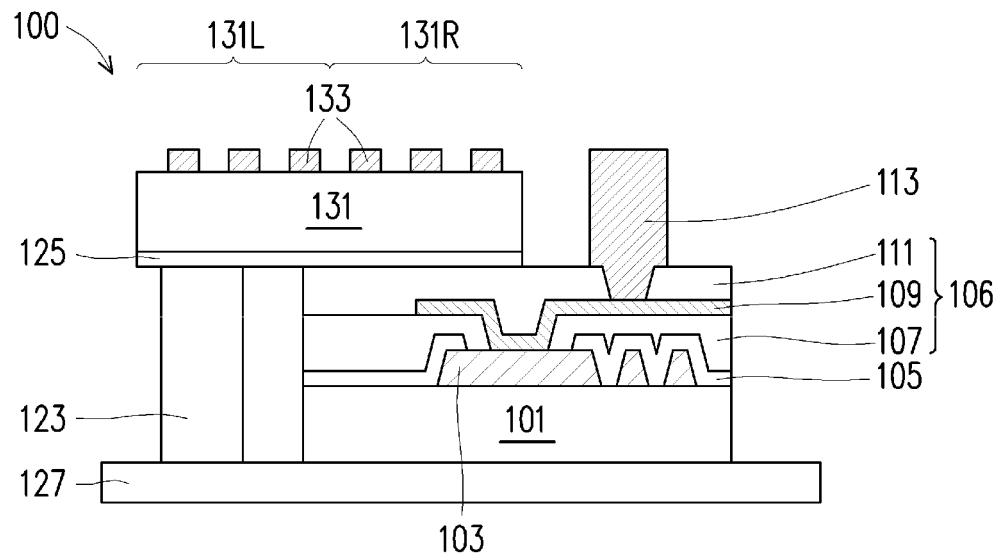

Next, in FIG. 9, the backside of a die 131 is attached to the upper surface of the die 123 and to the upper surface of the dielectric layer 111 by a dielectric film 125. FIG. 9 also illustrates die connectors 133 of the die 131, which die connectors 133 are conductive pillars (e.g., copper pillars) on the active side of the die 131, and are electrically coupled to the integrated circuits of the die 131. The die 131 may be a signal processing die, such as a base-band die. The dielectric film 125 may be an adhesive layer such as a DAF. The die 131 may be formed using a similar formation method and include similar features as the die 101.

As illustrated in FIG. 9, a portion 131R of the die 131 overlies (e.g., disposed directly over, or overlaps) the die 101, and another portion 131L of the die 131 is disposed outside lateral extents of the die 101. In other words, the portion 131R of the die 131 is disposed laterally between opposing sidewalls of the die 101, and the portion 131L of the die 131 is disposed laterally outside the opposing sidewalls of the die 101. After the die 131 is attached, the conductive pillars 113 are laterally adjacent to the die 131. In the example of FIG. 9, the die 101 and the die 123 are at a same level (e.g., a lower level) within the semiconductor device 100, and the die 131 and the conductive pillars 113 are at a same level (e.g., a higher level that is over the lower level) within the semiconductor device 100.

Figure 10:
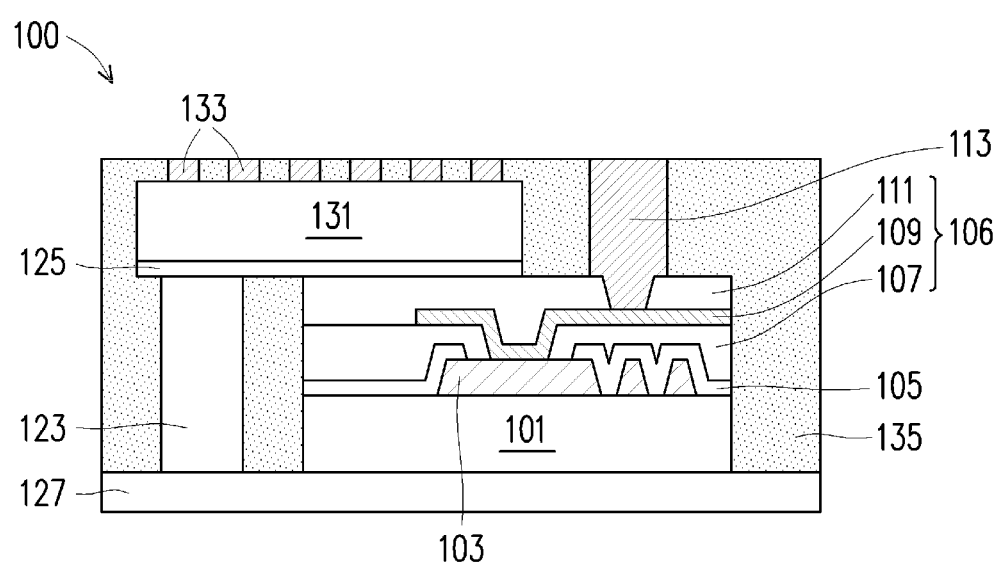

Next, in FIG. 10, a molding material 135 is formed over the carrier 127, and around the conductive pillars 113 and the dies 101/123/131. The molding material 135 may comprise an epoxy, an organic polymer, a polymer with or without a silica-based or glass filler added, or other materials, as examples. In some embodiments, the molding material 135 comprises a liquid molding compound (LMC) that is a gel type liquid when applied. The molding material 135 may also comprise a liquid or solid when applied. Alternatively, the molding material 135 may comprise other insulating and/or encapsulating materials. The molding material 135 is applied using a wafer level molding process in some embodiments. The molding material 135 may be molded using, for example, compressive molding, transfer molding, or other methods.

Next, the molding material 135 is cured using a curing process, in some embodiments. The curing process may comprise heating the molding material 135 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 135 may be cured using other methods. In some embodiments, a curing process is not included. A planarization process, such as chemical mechanical polish (CMP), may be performed to achieve a level upper surface for the molding material 135, and to expose upper surfaces of the die connectors 133 and the conductive pillars 113. In the example of FIG. 10, the molding material 135 is one volume of continuous molding material.

Figure 11A:
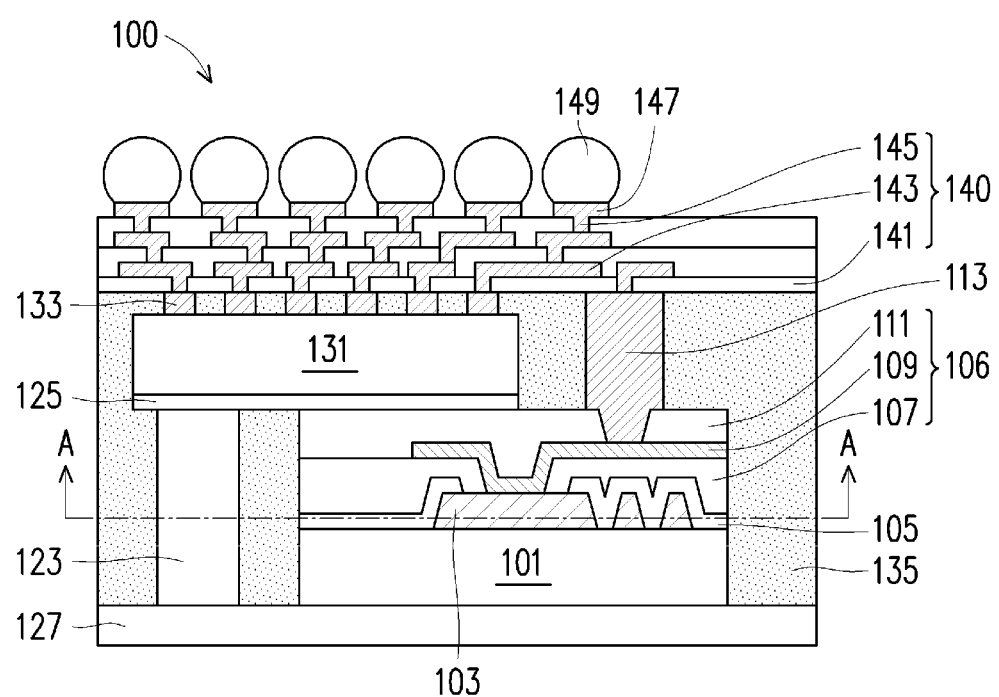

Next, in FIG. 11A, a redistribution structure 140 comprising conductive features (e.g., vias and conductive lines) is formed over the molding material 135. The conductive features of the redistribution structure 140 are electrically coupled to the die connectors 133 and to the conductive pillars 113, in some embodiments. Under bump metallurgy (UBM) structures 147 are formed over and electrically coupled to the redistribution structure 140, and external connectors 149 (e.g., conductive bumps) are formed over the UBM structures 147.

As illustrated in FIG. 11A, the redistribution structure 140 comprises conductive features such as one or more layers of conductive lines 143 and vias 145 formed in one or more dielectric layers 141. In some embodiments, the one or more dielectric layers 141 are formed of a polymer, such as PBO, polyimide, BCB, or the like. In other embodiments, the one or more dielectric layers 141 is formed of a nitride such as silicon nitride; an oxide such as silicon oxide, PSG, BSG, BPSG, or the like; or the like. The one or more dielectric layers 141 may be formed by any acceptable deposition process, such as spin coating, CVD, laminating, the like, or a combination thereof.

In some embodiments, the conductive features of the redistribution structure 140 comprise the conductive lines 143 and/or the conductive via 145 formed of a suitable conductive material such as copper, titanium, tungsten, aluminum, or the like. The conductive features may be formed by, e.g., forming openings in the dielectric layer 141 to expose underlying conductive features, forming a seed layer over the dielectric layer 141 and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. The above described process may be repeated to form multiple layers of conductive lines and/or vias.

Still referring to FIG. 11A, after the redistribution structure 140 is formed, the UBM structures 147 are formed over the redistribution structure 140 and are electrically coupled to conductive features (e.g., an uppermost metallization layer) of the redistribution structure 140. In an embodiment, the UBM structures 147 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 147. Any suitable materials or layers of material that may be used for the UBM structures 147 are fully intended to be included within the scope of the present disclosure.

Next, external connectors 149 are formed on the UBM structures 147. In an embodiment, the external connectors 149 are conductive bumps such as controlled collapse chip connection (C4) bumps and comprise a material such as tin, or other suitable materials, such as silver or copper. In an embodiment in which the external connectors 149 are tin solder bumps, the external connectors 149 may be formed by initially forming a layer of tin through any suitable method such as evaporation, electroplating, printing, solder transfer, ball placement, or the like. Once a layer of tin has been formed on the structure, a reflow is performed in order to shape the material into the bump shape with a diameter, e.g., of about 80 µm.

However, while the external connectors 149 have been described above as C4 bumps, these are merely intended to be illustrative and are not intended to limit the embodiments. Rather, any suitable type of external contacts, such as ball grid arrays (BGAs), microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 149, and all such external connectors are fully intended to be included within the scope of the embodiments.

Additional processing may follow the processing step of FIG. 11A. For example, a carrier de-bond process may be performed to remove the carrier 127 from the semiconductor device 100. In addition, a dicing process may be performed to separate the semiconductor device 100 from neighboring devices. After the dicing process, the redistribution structure 140 of the semiconductor device 100 is conterminous with the molding material 135 of the semiconductor device 100. For simplicity, these additional processing are not illustrated.

Figure 11B:
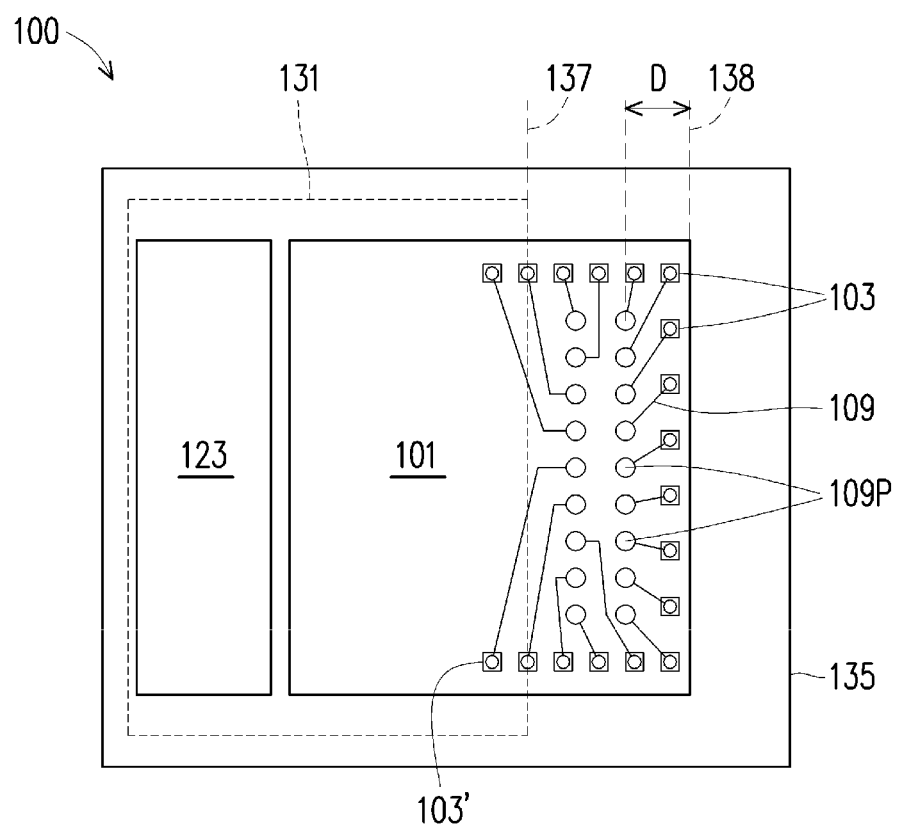

FIG. 11B illustrates a cross-sectional view (e.g., a plan view) of the semiconductor device 100 of FIG. 11A along cross-section A-A. Note that for clarity, not all features of the semiconductor device 100 are illustrated in FIG. 11B. In addition, to illustrate the relative locations of various features, some features no visible at the cross-sectional A-A are also illustrated in FIG. 11B.

As illustrated in FIG. 11B, the die 101 (e.g., the memory die) has U-shaped pads 103 (e.g., I/O pads) disposed along three sides of the die 101. The RDL 109 (e.g., conductive lines and/or vias) are electrically coupled to the pads 103, and re-routes the electrical connection to each pad 103 to a new location illustrated by a respective pad region 109P. The pad region 109P of the RDL 109 may have a circular shape, as illustrated in FIG. 11B, but other suitable shapes, such as oval, rectangle, square, or the like, may also be used. In some embodiments, each pad region 109P has a conductive pillar 113 formed thereon.

FIG. 11B also illustrates the die 123 and the die 131 (illustrated in phantom). The pad regions 109P (and therefore the conductive pillars 113) are formed in area between an edge 137 of the die 131 and an edge 138 of the die 101. In some embodiments, a distance D between the edge 138 of the die 101 and an adjacent (e.g., immediate adjacent) pad region 109P is between about 40 µm and about 500 µm, although other dimensions are also possible. In the illustrated embodiment, the location of the pad regions 109P leaves enough room over the dies 101/123 for attaching the die 131, and allows the conductive pillars 113 (see FIG. 11A) to be formed over the die 101 (e.g., laterally adjacent to the die 131) without interfering with the attachment of the die 131. Without the redistribution structure 106, electrical connections to some I/O pads (e.g., 103') of the die 101 disposed within the boundary of the die 131 may not be possible. In other words, by re-routing the electrical connection to each pad (e.g., 103, 103') of the die 101 to a new location, the redistribution structure 106 is able to accommodate the use of a wide variety of dies (e.g., 101) with different I/O pad locations in the semiconductor device 100.

Figure 12:
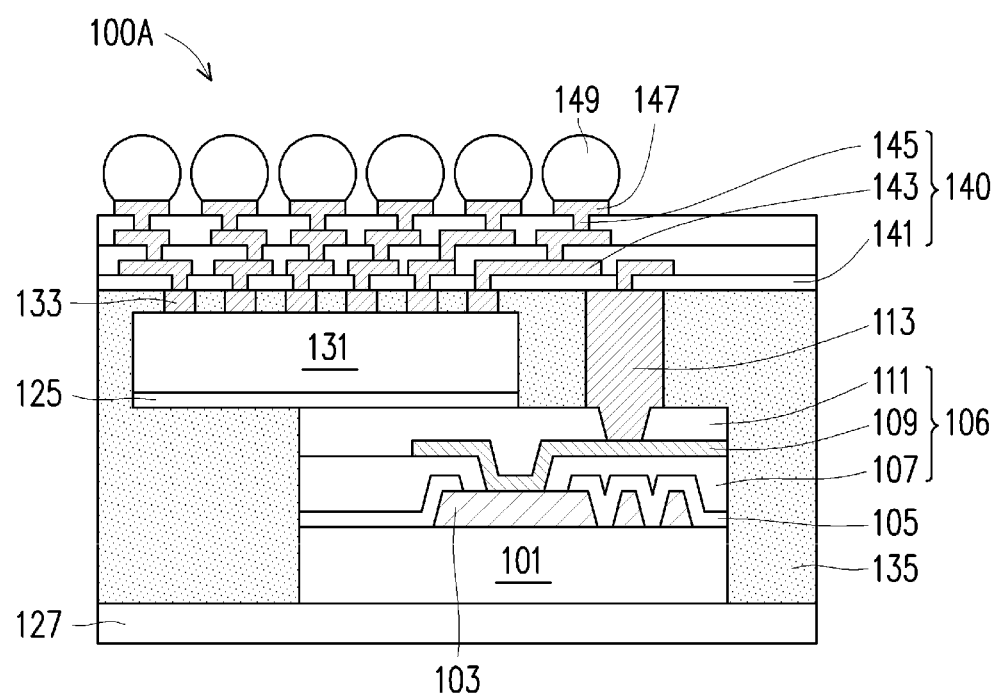
FIG. 12 illustrates a cross-sectional view of a semiconductor device, in an embodiment.

FIG. 12 illustrates the cross-sectional view of a semiconductor device 100A, in an embodiment. Throughout the description herein, unless otherwise specified, the same numeral in different figures refer to a same or similar element formed by a same or similar process, thus details may not be repeated. The semiconductor device 100A is similar to the semiconductor device 100 of FIG. 11A, but without the die 123 underlying the die 131. The fabrication process for the semiconductor device 100A may be similar to those illustrated in FIGS. 2-10 and 11A, but without the die 123 formed, thus details are not repeated. As illustrated in FIG. 12, the dielectric film 125 (e.g., a DAF) is laterally coterminous with the integrated circuit die 131, and therefore, the portion (e.g., the left portion) of the die 131 outside the lateral extents of the die 101 has the dielectric film 125 attached to its lower surface.

Figure 13:
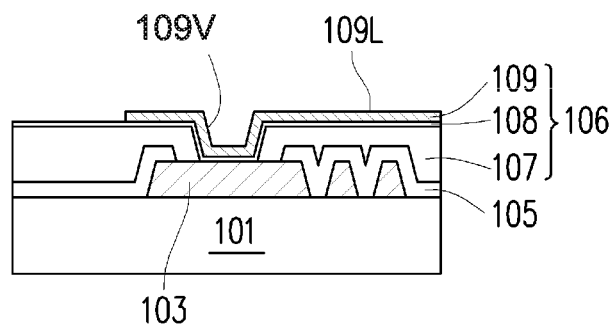
FIGS. 13-19 illustrate cross-sectional views of a semiconductor device at various stages of fabrication, in accordance with an embodiment.

FIGS. 13-19 illustrate cross-sectional views of a semiconductor device 200 (e.g., a 3DIC package) at various stages of fabrication, in accordance with an embodiment. Referring to FIG. 13, the dielectric layer 107 is formed over the die 101 (e.g., a memory die), and openings are formed in the dielectric layer 107 to expose pads 103 of the die 101. Next, a seed layer 108 is formed over the dielectric layer 107 and over the exposed pads 103. The seed layer 108 may include copper (Cu), titanium (Ti), tantalum (Ta), titanium nitride (TiN), tantalum nitride (TaN), the like, or a combination thereof, and may be deposited by atomic layer deposition (ALD), sputtering, physical vapor deposition (PVD), or the like. In some embodiments, the seed layer 108 is a metal layer, which may be a single layer or a composite layer comprising a plurality of sub-layers formed of different materials. For example, the seed layer 108 may comprise a titanium layer and a copper layer over the titanium layer.

Next, the RDL 109 is formed over the seed layer 108. In some embodiments, the RDL 109 is formed by forming a patterned photoresist with a designed pattern over the seed layer 108, plating (e.g., electroplating or electroless plating)

a conductive material (e.g., copper) in the designed pattern and over the seed layer 108, and removing the photoresist. Note that the seed layer 108 is not removed after the RDL 109 is formed at this stage. Instead, the seed layer 108 is removed in a subsequent etching process after the conductive pillars 113 are formed (see FIG. 14). The RDL 109 includes vias 109V and conductive lines 109L. The RDL 109 may also include pad regions 109P (see, e.g., FIGS. 11B and 14) that are coupled to subsequently formed conductive pillars 113.

The dielectric layer 107, the seed layer 108, and the RDL 109 in FIG. 13 form the redistribution structure 106 (also referred to as the fan-in redistribution structure) of the semiconductor device 200. Note that the redistribution structure 106 of the semiconductor device 200 has the RDL 109 as the uppermost layer and thus, the RDL 109 (e.g., conductive lines, vias) is not covered by a dielectric layer of the redistribution structure 106. Although the seed layer 108 is shown as a separate layer in FIG. 13, there may not be a visible interface between the seed layer 108 and the RDL 109.

Figure 14:
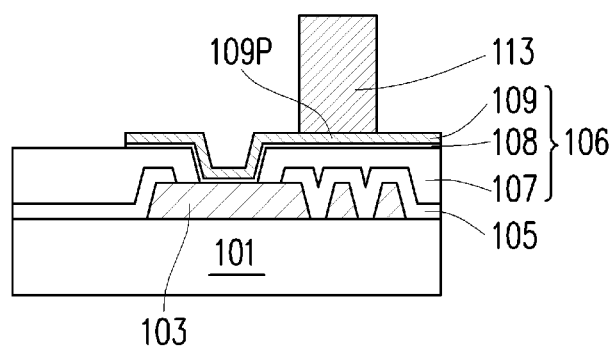

Next, in FIG. 14, conductive pillars 113 are formed over portions of the RDL 109, e.g., over the pad regions 109P. Since the seed layer 108 is not etched after the processing of FIG. 13, the conductive pillar 113 is formed over the RDL 109 and/or the seed layer 108 without the need to form another seed layer over the RDL 109, in some embodiments. This advantageously reduces the cost and processing time of the fabrication process.

The conductive pillars 113 may be formed by, e.g., forming a patterned photoresist with a designed pattern over the RDL 109 (e.g., pad region 109P), plating (e.g., electroplating or electroless plating) a conductive material (e.g., copper) in the designed pattern and over the RDL 109 and/or the seed layer 108, and removing the photoresist. After removing the photoresisit, an etching process is performed to remove portions of the seed layer 108 on which the RDL 109 or the conductive pillar 113 is not formed. Other methods for forming the conductive pillars 113 are possible and are fully intended to be included within the scope of the present disclosure.

In some embodiments, the RDL 109 comprises copper, and therefore, the conductive pillar 113 is formed (e.g., plated) over the RDL 109 without the use of a seed layer in between, which seed layer, if used, may include a sub-layer of barrier layer (e.g., titanium, titanium nitride, or the like). In other words, the conductive pillars 113 are formed directly over (e.g., in physical contact with) the RDL 109 (e.g., the pad regions 109P), thus the interface between the RDL 109 and the conductive pillars 113 is a copper-to-copper interface (e.g., without any barrier layer material in between). The copper-to-copper interface advantageously reduces the resistance of the conductive pillar 113, thus reducing the resistance-capacitance (RC) delay of the semiconductor device formed.

Figure 15:
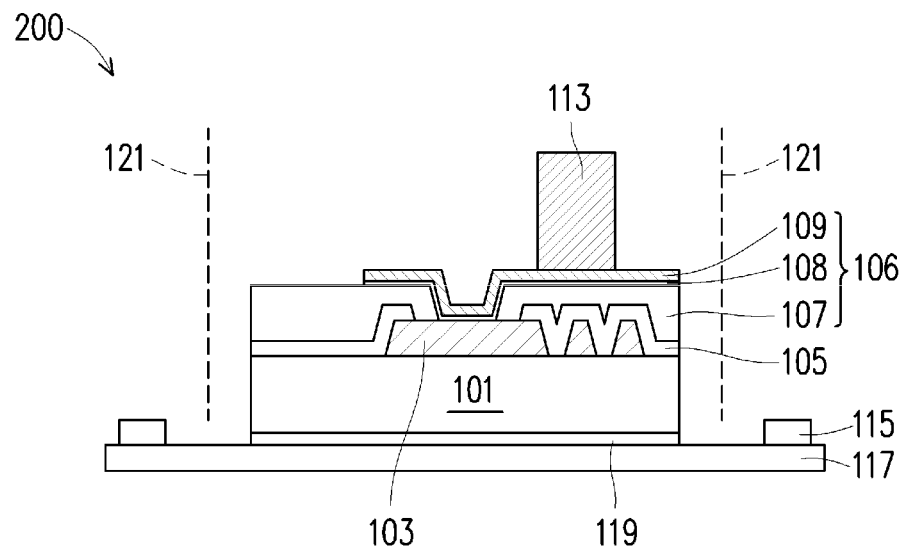

Next, the backside of the die 101 is thinned using a thinning process. After the thinning process, the backside of the die 101 is attached to the tape 117 supported by the frame 115, as illustrated in FIG. 15. An adhesive layer 119, such as a DAF, may be used to attach the die 101 to the tape 117. Next, a dicing process is performed along the dicing lines 121 to separate the semiconductor device 200 from other neighboring semiconductor devices. An optional cleaning process such as a scrubber cleaning process may be performed after the dicing process. As illustrated in FIG. 15, after the dicing process, the redistribution structure 106 is conterminous with the die 101. In other words, sidewalls of the redistribution structure 106 are aligned with sidewalls of the die 101.

Figure 16:
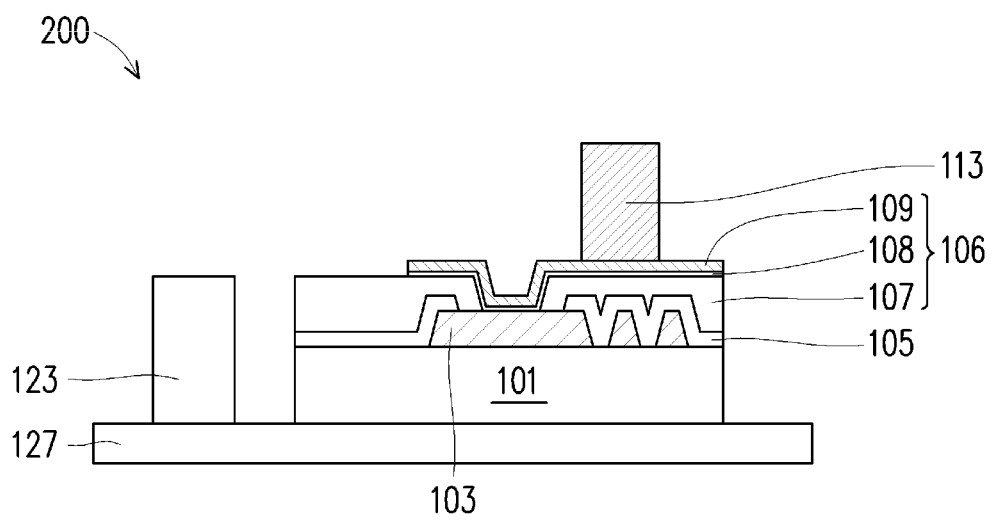

Next, in FIG. 16, the semiconductor device 200 in FIG. 15 is removed from the tape 117 and attached to the carrier 127. In addition, the die 123 is also attached to the carrier 127 adjacent to the die 101. Adhesive layers, such as DAF, may be used to attach the die 101 and the die 123. In some embodiments, the die 123 is a dummy die (e.g., without any functional circuit), and is used to provide mechanical support for the subsequently attached die 131 (see FIG. 17). In other embodiments, the die 123 is a memory die, and may be of the same type of memory die as the die 101.

Figure 17:
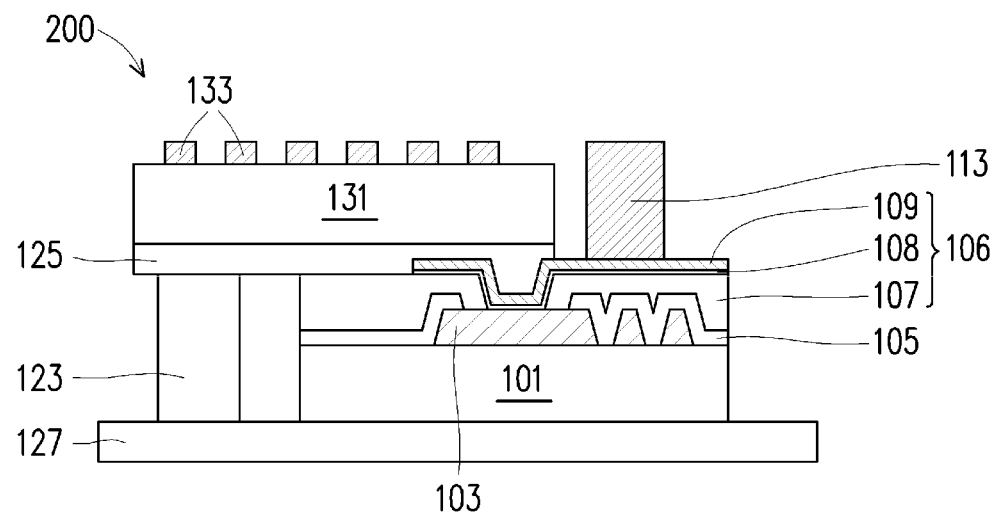

Next, in FIG. 17, the die 131, which may be a signal processing die (e.g., a base-band die), is attached to the die 123 and to the die 101 (e.g., through the redistribution structure 106). After being attached, the die 131 overlies the die 123, and overlies a portion of the die 101. In other words, a portion of the die 131 is disposed outside the lateral extents of the die 101. The conductive pillars 113 are disposed laterally adjacent to the die 131.

In the illustrated embodiment, the dielectric film 125 (e.g. a DAF) is used to attach the die 131 to the dies 101/123. Since the RDL 109 is the uppermost layer of the redistribution structure 106, the dielectric film 125 physically contacts the RDL 109. The dielectric film 125 also physically contacts the dielectric layer 107 underlying the die 131. By not forming an additional dielectric layer over the RDL 109 in the redistribution structure 106, material cost and processing time are reduced. In addition, heat dissipation of the die 101 may be improved, which improves the performance of the semiconductor device 200 formed.

Figure 18:
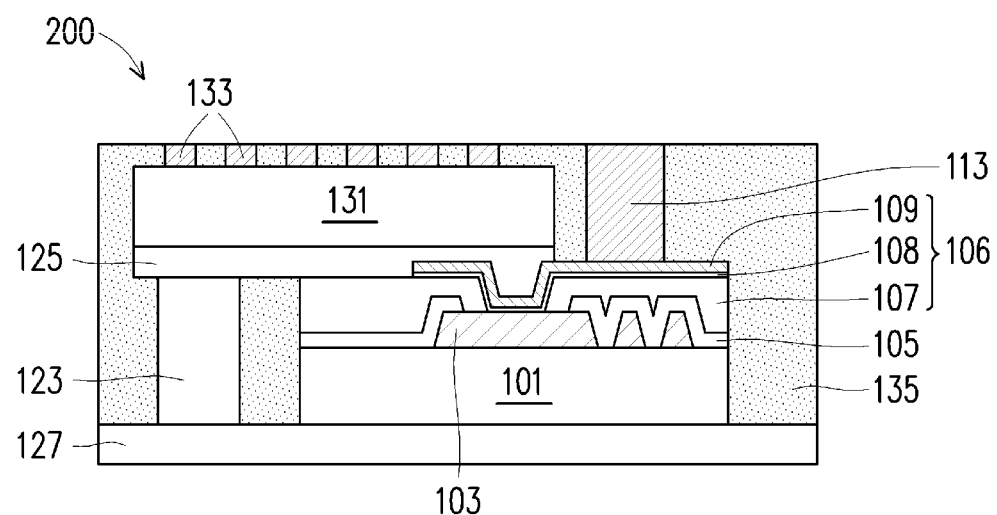

Next, in FIG. 18, the molding material 135 is formed over the carrier 127, and around the conductive pillars 113 and the dies 101/123/131. A planarization process, such as CMP, may be performed to achieve a level upper surface for the molding material 135, and to expose upper surfaces of the die connectors 133 and the conductive pillars 113.

Figure 19:
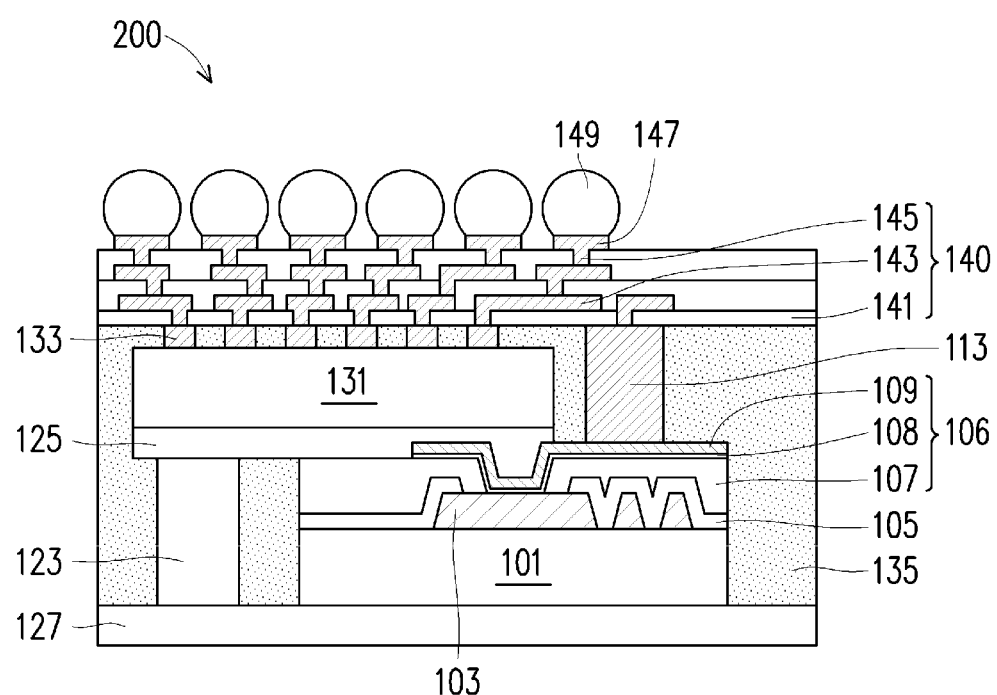

Next, in FIG. 19, the redistribution structure 140 comprising conductive features (e.g., vias and conductive lines) is formed over the molding material 135. The conductive features of the redistribution structure 140 are electrically coupled to the die connectors 133 and to the conductive pillars 113, in the illustrated embodiment. The UBM structures 147 are formed over and electrically coupled to the redistribution structure 140, and external connectors 149 (e.g., conductive bumps) are formed over the UBM structures 147.

Additional processing may follow the processing step of FIG. 19. For example, a carrier de-bond process may be performed to remove the carrier 127 from the semiconductor device 200. In addition, a dicing process may be performed to separate the semiconductor device 200 from neighboring devices. After the dicing process, the redistribution structure 140 of the semiconductor device 200 is conterminous with the molding material 135 of the semiconductor device 200. For simplicity, these additional processing are not illustrated.

Figure 20:
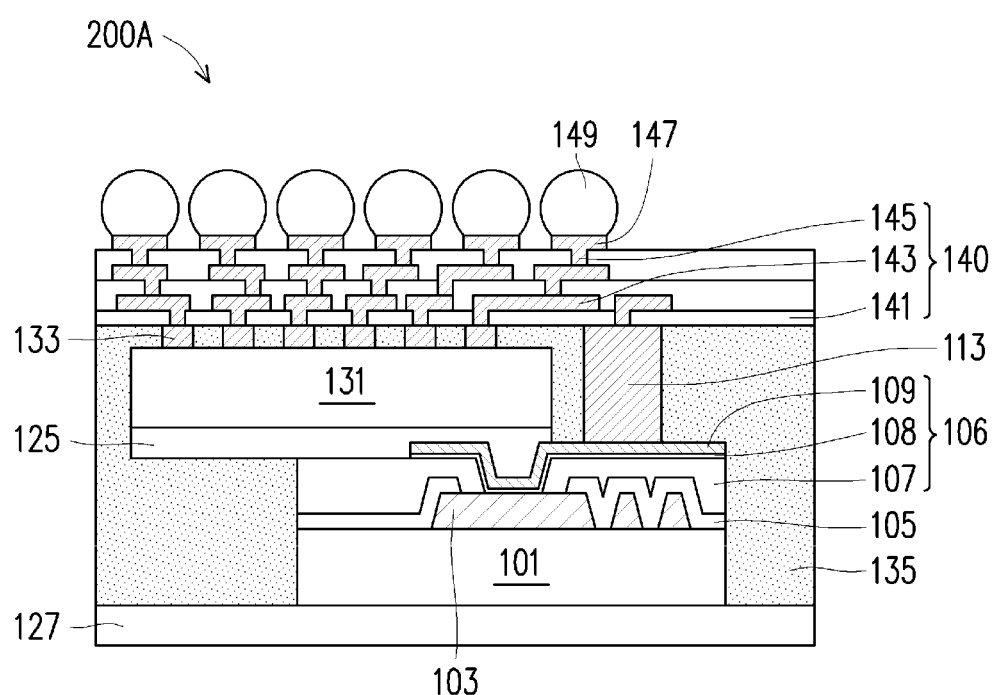
FIG. 20 illustrates a cross-sectional view of a semiconductor device, in an embodiment.

FIG. 20 illustrates the cross-sectional view of a semiconductor device 200A, in an embodiment. The semiconductor device 200A is similar to the semiconductor device 200 of FIG. 19, but without the die 123 underlying the die 131. The fabrication process for the semiconductor device 200A may be the same or similar to those illustrated in FIGS. 13-19, but without the die 123 formed, thus details are not repeated.

Figure 21A:
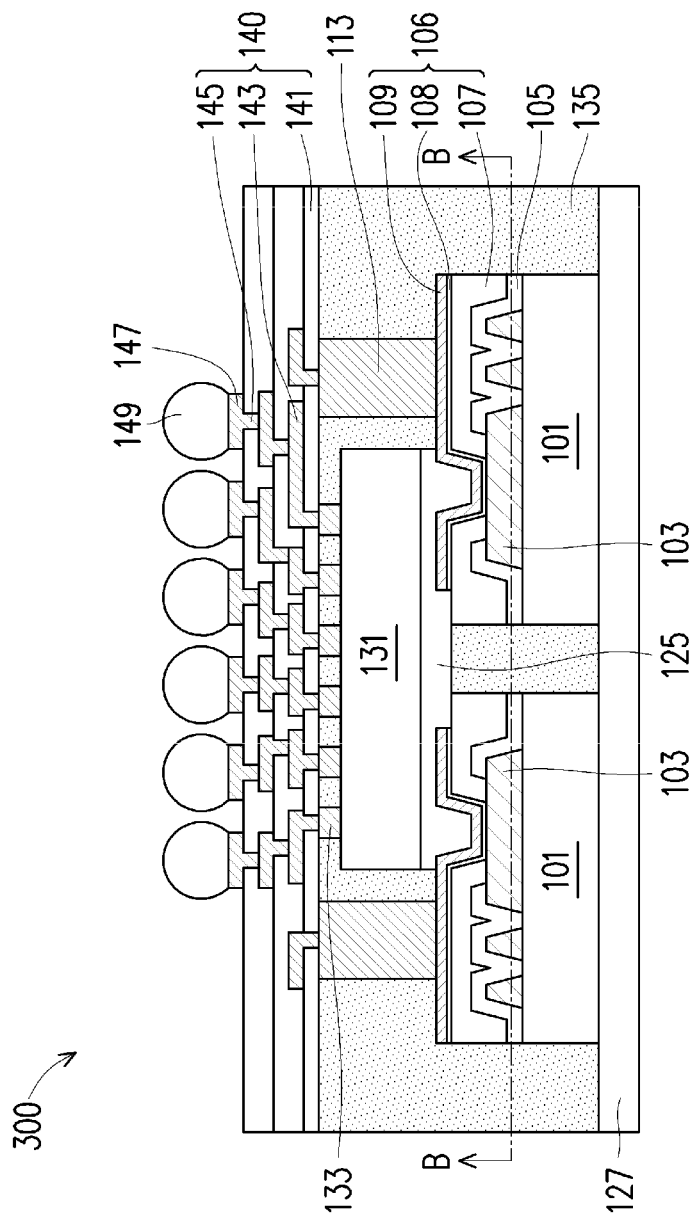
FIGS. 21A and 21B illustrate cross-sectional views of a semiconductor device, in an embodiment.
Figure 21B:
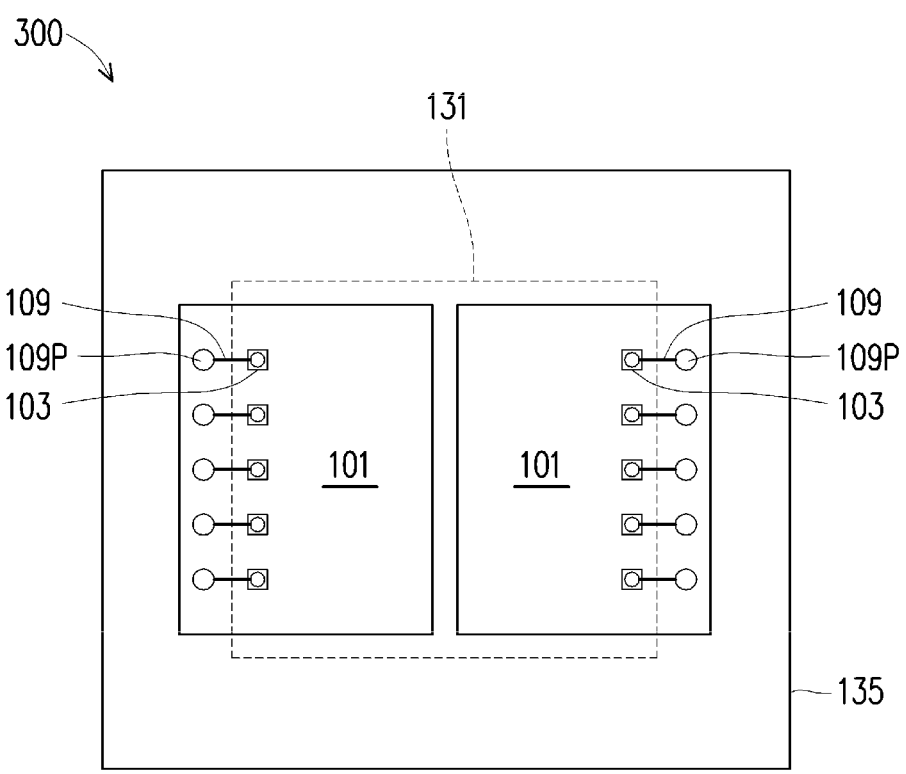

FIGS. 21A and 21B illustrate cross-sectional views of a semiconductor device 300. The semiconductor device 300 is similar to the semiconductor device 200A of FIG. 20, but with two dies 101 (e.g., two DRAM dies) underlying the die 131 (e.g., a base-band die). In particular, each of the dies 101 has the redistribution structure 106 formed thereon to re-reroute electrical connections to the I/O pads of the die 101 toward a perimeter (e.g., sidewall) of the die 101, thereby making room for attachment of the die 131. The locations of the I/O pads of the dies 101 may correspond to those of FIG. 1B.

FIG. 21B illustrates the cross-sectional view of the semiconductor device 300 in FIG. 21A along cross-section B-B. Note that for clarity, not all features of the semiconductor device 300 are illustrated in FIG. 21B. In addition, to illustrate the relative locations of various features, some features no visible at the cross-sectional B-B are also illustrated in FIG. 21B.

As illustrated in FIG. 21B, the I/O pads 103 of the die 101 are electrically coupled to pad regions 109P of the redistribution structure 106 through the conductive lines of the RDL 109. The pad regions 109P are closer to a perimeter (e.g., an edge, a sidewall) of the die 101, thereby leaving more room for the die 131 (shown in phantom) to be attached over the dies 101. Without the redistribution structure 106 of the present disclosure, the dies 101 may have to be spaced apart further to make room for the attachment of the die 131, which would result in a larger package size for the semiconductor device 300, more molding materials 135 being used, and potentially more warpage.

Figure 22:
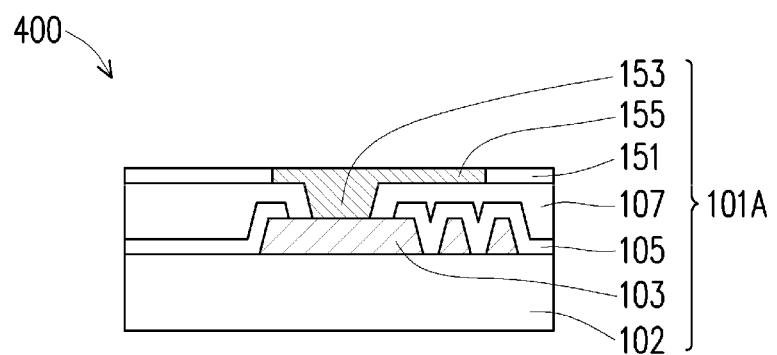
FIGS. 22-26 illustrate cross-sectional views of a semiconductor device at various stages of fabrication, in accordance with an embodiment.

FIGS. 22-26 illustrate cross-sectional views of a semiconductor device 400 at various stages of fabrication, in an embodiment. Illustrated in FIG. 22 is a die 101A. The die 101A is similar to the die 101 of FIG. 2, but with die connectors 153 (e.g., copper pillars) formed over and electrically coupled to the pads 103. The die connectors 153 may extend through dielectric layers (e.g., 151, 107) to connect with the pads 103. The dielectric layers 151/107 of the die 101A may comprise a same or similar material as the passivation film 105, and the die connectors 153 may be formed by plating or any other suitable method.

FIG. 22 also illustrates conductive traces 155 (e.g., copper lines) coupled to the die connectors 153 (e.g., copper connectors). The conductive traces 155 comprise a same electrically conductive material (e.g., copper) as the die connectors 153, and may be formed in a same processing step as the die connectors 153, in some embodiments. In other words, the conductive traces 155 are formed during the process to form the die 101A. In the illustrated example of FIG. 22, the upper surface of the conductive trace 155 is level with the upper surface of the die connector 153, which may due to the fabrication process used to form the conductive trace 155 and the die connectors 153, such as a plating process followed by a CMP process. In other embodiments, the upper surface of the conductive trace 155 is higher (e.g., extends further from the substrate 102) than the upper surface of the die connector 153. As illustrated in FIG. 22, the conductive traces 155 extend along an upper surface of the die 101A, and re-route electrical connections to the pads 103 (e.g., aluminum pads) from first locations to second locations at the upper surface of the die 101A. Since the first locations and the second locations are within the boundaries (e.g., perimeters, or sidewalls) of the die 101A, the conductive traces 155 act as a fan-in redistribution layer, in the illustrated embodiment. The conductive traces 155 allows each subsequently formed conductive pillar 113 (see FIG. 25) to be formed at a location that is not directly over a respective pad 103, thereby making room for attachment of the die 131 (see FIG. 25).

Figure 23:
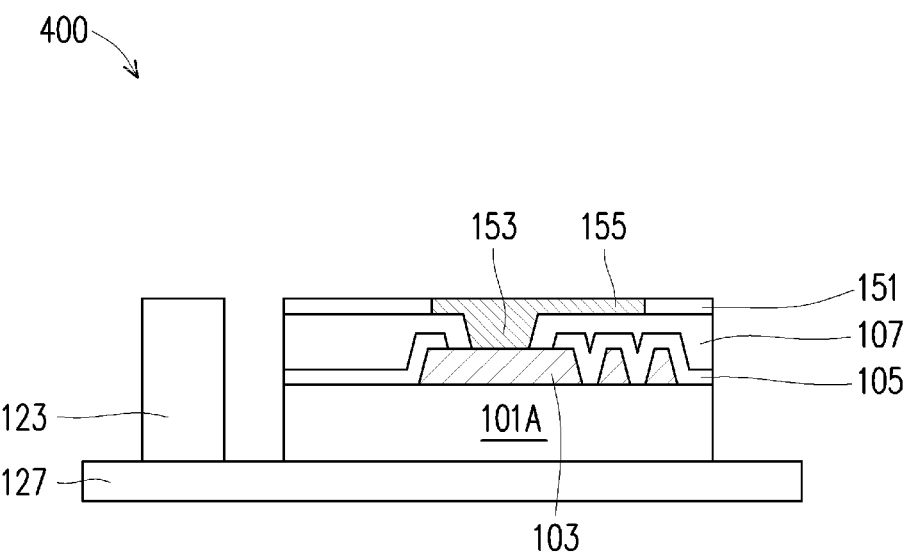

Next, in FIG. 23, the die 101A is attached to the carrier 127 by, e.g., a DAF. The die 123, which may be, e.g., a dummy die or another memory die, is also attached to the carrier 127 by, e.g., a DAF. An upper surface of the die 123 is level with an upper surface of the die 101A, in the illustrated example of FIG. 23.

Figure 24:
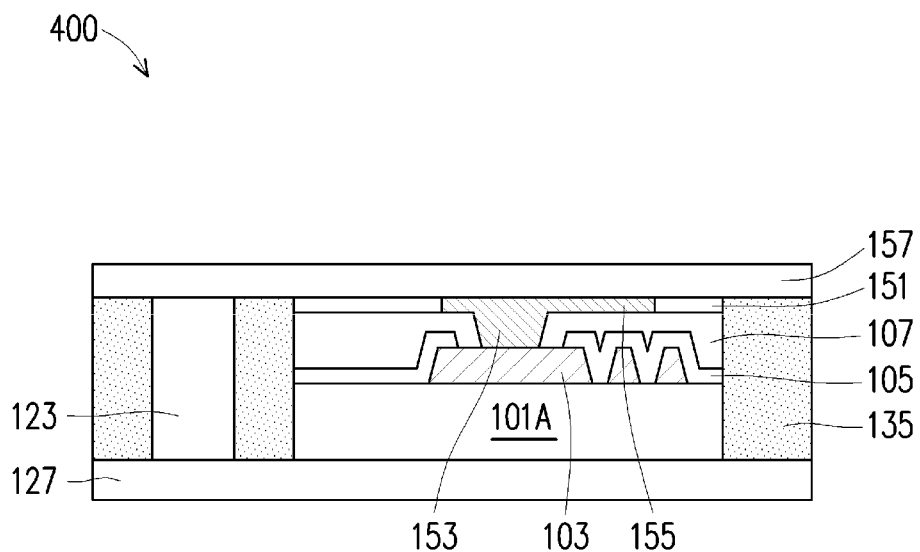

Next, in FIG. 24, the molding material 135 is formed over the carrier 127 and around the dies 101A and 123. A planarization process, such as CMP, may be performed to achieve a level upper surface for the molding material 135, and to expose the die connectors 153 and the conductive traces 155, in some embodiments. Next, a dielectric layer 157, which may be a polymer layer, is formed over the molding material 135, the die 123 and the die 101A.

Figure 25:
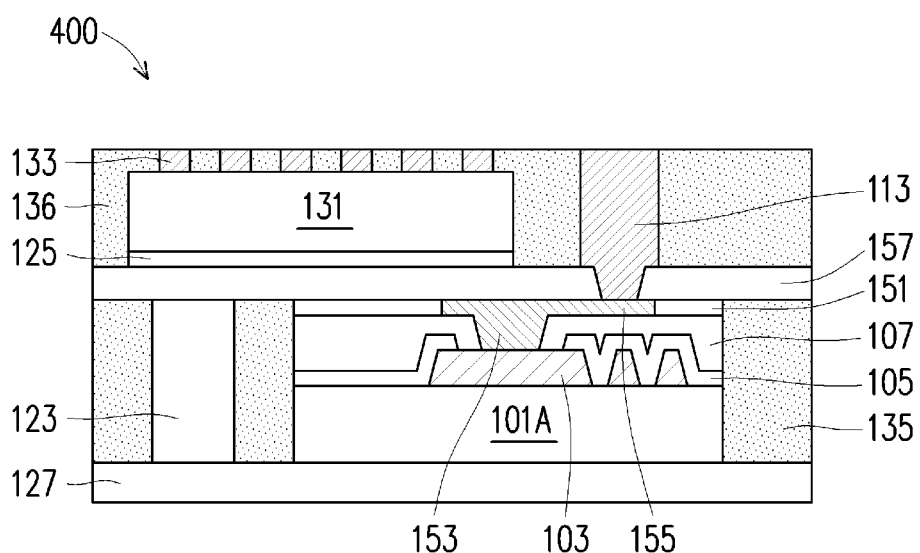

Next, in FIG. 25, the conductive pillars 113 are formed over the dielectric layer 157 and are electrically coupled to the conductive traces 155 of the die 101A. The conductive pillar 113 may be formed by: forming an opening in the dielectric layer 157 to expose an underlying conductive trace 155, forming a seed layer over the dielectric layer 157 and in the opening, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. Other methods for forming the conductive pillar 113 are possible and are fully intended to be included within the scope of the present disclosure.

Next, the die 131 is attached to the dielectric layer 157 by the dielectric film 125 (e.g., a DAF). Another molding material 136, which may comprise a same material as the molding material 135, is formed over the dielectric layer 157, around the die 131, and around the conductive pillars 113. A planarization process, such as CMP, may be performed after the molding material 136 is formed to achieve a level upper surface for the molding material 136, and to expose the die connectors 133 and the conductive pillars 113.

Figure 26:
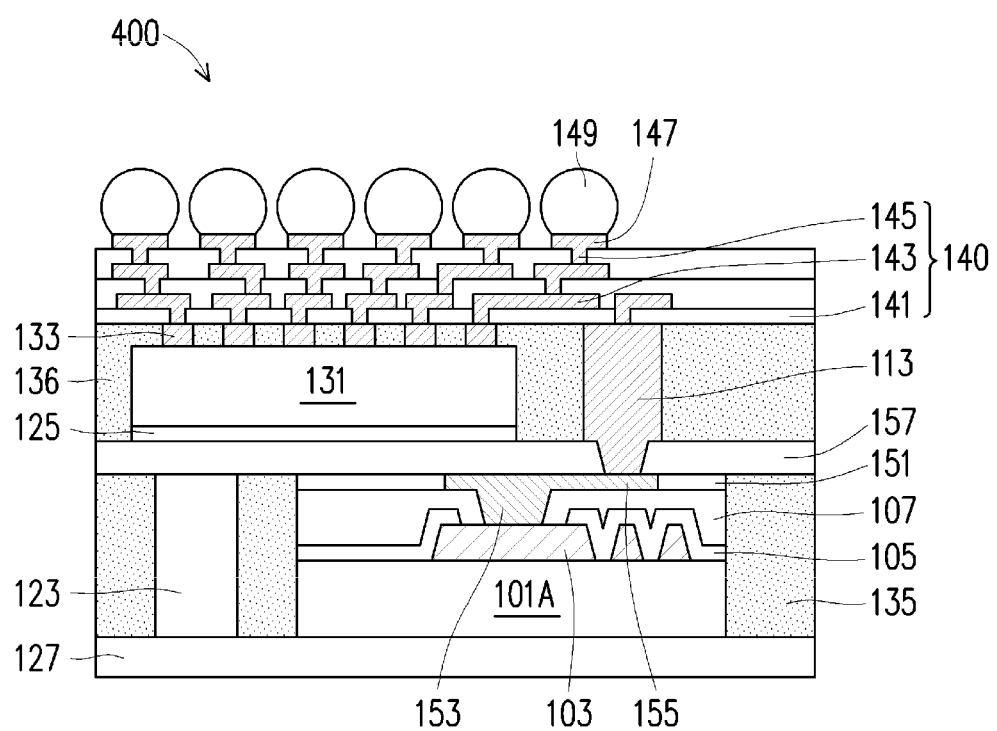

Next, in FIG. 26, the redistribution structure 140 comprising conductive features (e.g., vias and conductive lines) is formed over the molding material 136. The conductive features of the redistribution structure 140 are electrically coupled to the die connectors 133 and to the conductive pillars 113, as illustrated in FIG. 26. Under bump metallurgy (UBM) structures 147 are formed over and electrically coupled to the redistribution structure 140, and external connectors 149 (e.g., conductive bumps) are formed over the UBM structures 147.

Additional processing, such as de-bonding of the carrier 127 from the semiconductor device 400, may be performed. For simplicity, the additional processing is not illustrated.

Figure 27:
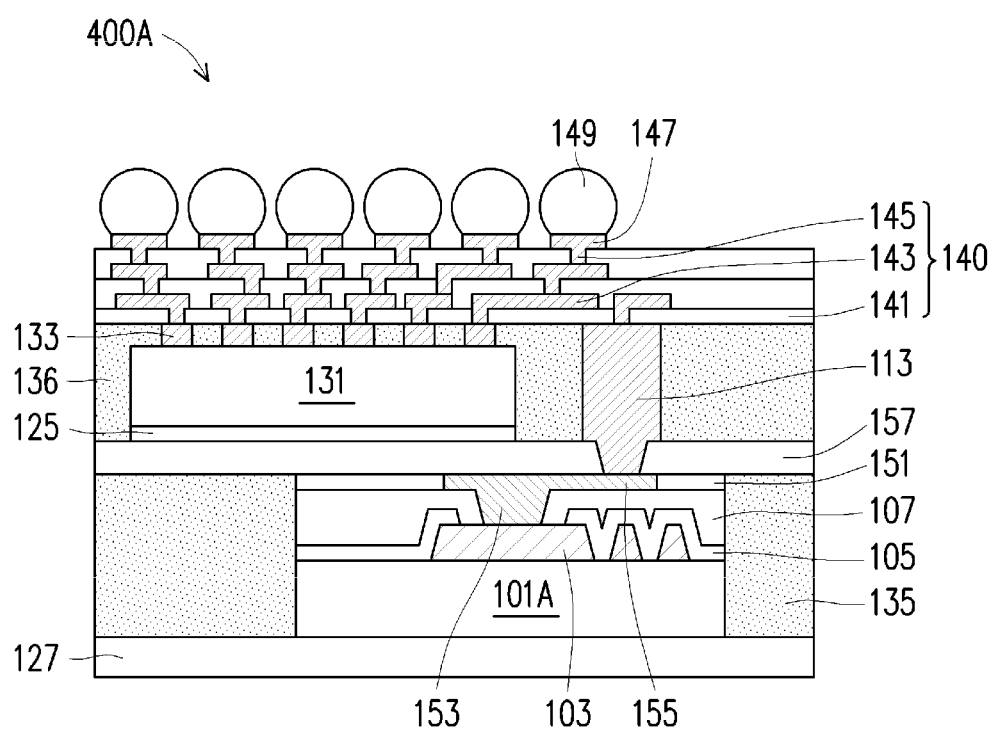
FIGS. 27-29 illustrate cross-sectional views of various semiconductor devices, in various embodiments.

FIG. 27 illustrates the cross-sectional view of a semiconductor device 400A, in an embodiment. The semiconductor device 400A is similar to the semiconductor device 400 of FIG. 26, but without the die 123 underlying the die 131.

Figure 28:
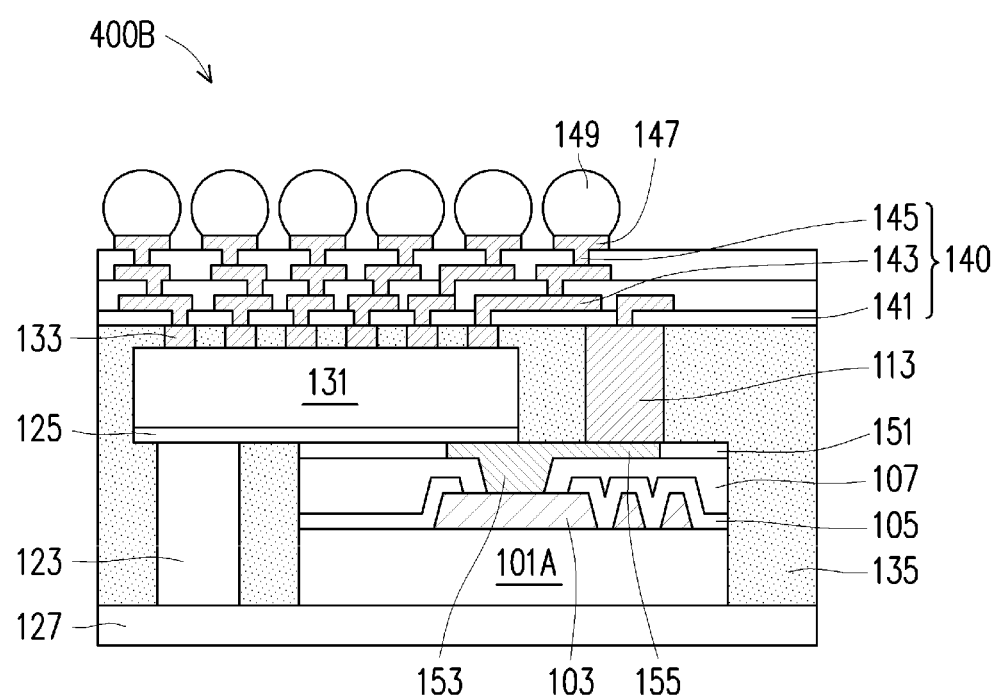

FIG. 28 illustrates the cross-sectional view of a semiconductor device 400B, in an embodiment. The semiconductor device 400B is similar to the semiconductor device 400 of FIG. 26, but without the dielectric layer 157 formed. As a result, after the die 131 is attached to the dies 123/101A, the molding material 135 may be formed in a single process to surround the conductive pillar 113 and the dies 101A/123/131.

Figure 29:
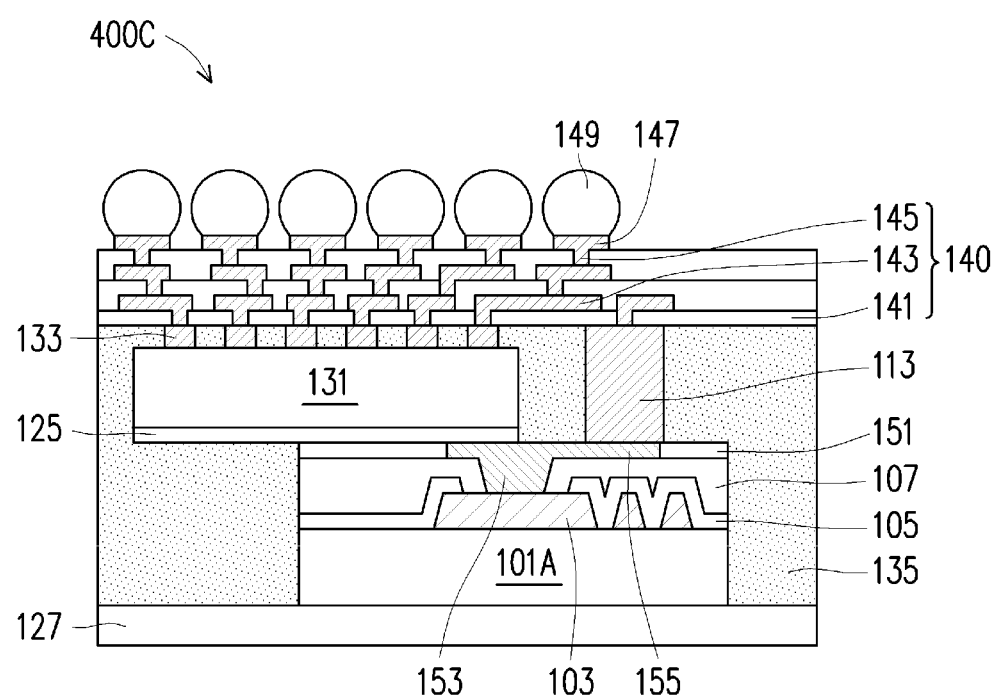

FIG. 29 illustrates the cross-sectional view of a semiconductor device 400C, in an embodiment. The semiconductor device 400C is similar to the semiconductor device 400B of FIG. 28, but without the die 123 underlying the die 131.

Embodiments may achieve advantages. For example, the redistribution structure 106 formed over the die 101 (or the conductive trace 155 of the die 101A) allows for dies (e.g., memory dies) with different I/O pad locations to be integrated with the die 131 (e.g., base-band die), thus offering flexibility in the choice of dies used for integration in the semiconductor devices (e.g., 100, 200, 300, 400). Additional advantages include improved heat dissipation for embodiments where the RDL 109 is the uppermost layer of the redistribution structure 106 (see, e.g., FIG. 19 and FIG. 20). In addition, the copper-to-copper interface between the conductive pillars 113 and the RDL 109 in, e.g., the semiconductor device 200 and 200A, reduces resistance of the conductive pillars 113, thus reducing the RC delay of the device formed. Furthermore, in some embodiments, the molding material 135 may be formed by a single molding process to surround the dies 101/123/131 and the conductive pillars 113, thus reducing the cost and production time for the semiconductor device.

Figure 30:
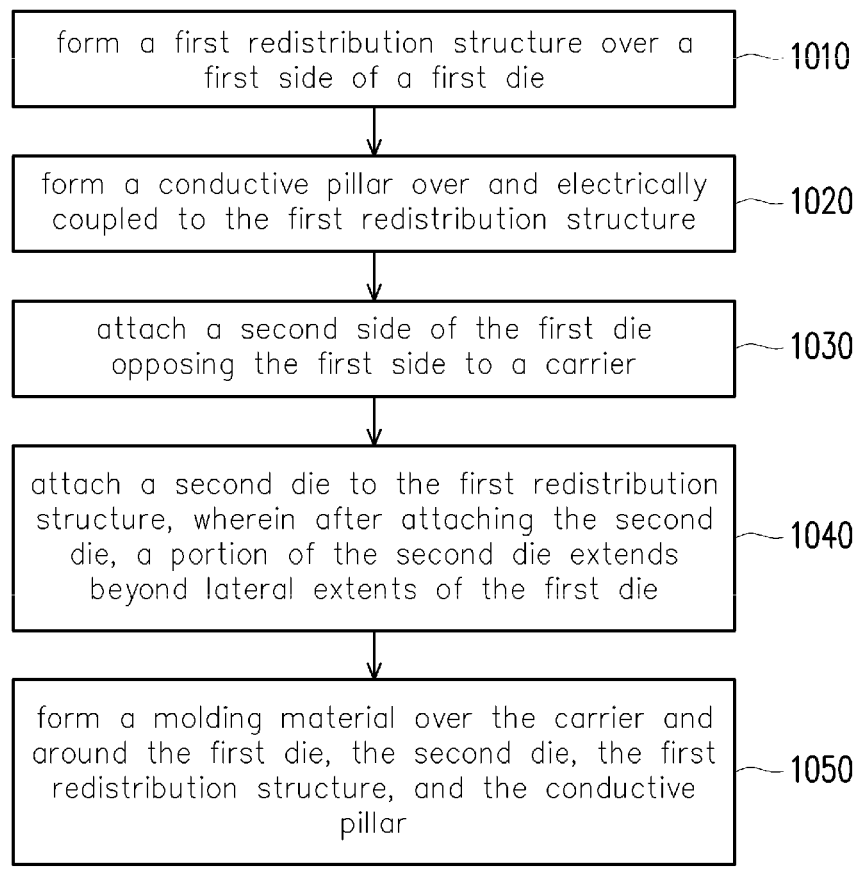
FIG. 30 illustrates a flow diagram of method of forming a semiconductor device, in some embodiments.

FIG. 30 illustrates a flow chart for a method 1000 of forming a semiconductor device, in some embodiments. It should be understood that the embodiment method shown in FIG. 30 is merely an example of many possible embodiment methods. One of ordinary skill in the art would recognize many variations, alternatives, and modifications. For example, various steps as illustrated in FIG. 30 may be added, removed, replaced, rearranged and repeated.

Referring to FIG. 30, at step 1010, a first redistribution structure is formed over a first side of a first die. At step 1020, a conductive pillar is formed over and electrically coupled to the first redistribution structure. At step 1030, a second side of the first die opposing the first side is attached to a carrier. At step 1040, a second die is attached to the first redistribution structure, where after attaching the second die, a portion of the second die extends beyond lateral extents of the first die. At step 1050, a molding material is formed over the carrier and around the first die, the second die, the first redistribution structure, and the conductive pillar.

In an embodiment, a semiconductor package includes a first die; a second die attached to the first die, a first portion of the first die extending beyond a lateral extent of the second die; a conductive pillar over the first portion of the first die and laterally adjacent to the second die, the conductive pillar electrically coupled to first die; a molding material around the first die, the second die, and the conductive pillar; and a first redistribution structure over the molding material, the first redistribution structure electrically coupled to the conductive pillar and the second die. In an embodiment, the semiconductor package further includes a third die laterally adjacent to the first die and underlying the second die. In an embodiment, the third die is a dummy die. In an embodiment, the semiconductor package further includes a second redistribution structure between the first die and the second die, the second redistribution structure being conterminous with the first die, the conductive pillar electrically coupled to the first die through the second redistribution structure. In an embodiment, the second redistribution structure includes pad regions disposed over the first portion of the first die, where each of the pad regions is electrically coupled to an input/output (IO) pad of the first die. In an embodiment, the conductive pillar is over and electrically coupled to a pad region. In an embodiment, the semiconductor package further includes a dielectric layer between the second die and the second redistribution structure. In an embodiment, an uppermost layer of the second redistribution structure includes an electrically conductive feature, where the dielectric layer contacts the electrically conductive feature. In an embodiment, the first die has a die connector and a conductive trace electrically coupled to the die connector, an upper surface of the conductive trace being level with an upper surface of the die connector, where the conductive pillar is electrically coupled to the conductive trace of the first die. In an embodiment, the semiconductor package further includes a dielectric layer between the conductive trace and second die, the conductive pillar extending through the dielectric layer to electrically couple with the conductive trace of the first die. In an embodiment, the molding material includes a first molding material below the dielectric layer and around the first die; and a second molding material above the dielectric layer and around the second die and the conductive pillar.

In an embodiment, a semiconductor package includes a first die; a second die over the first die; a first redistribution structure between the first die and the second die, the first redistribution structure electrically coupled to the first die, sidewalls of the first redistribution structure aligned with sidewalls of the first die; a conductive pillar over and electrically coupled to the first redistribution structure; and a molding material around the first die, the second die, the first redistribution structure, and the conductive pillar, where a first portion of the first die underlies the second die, and a second portion of the first die underlies a portion of the molding material. In an embodiment, a conductive feature of the first redistribution structure is disposed over the second portion of the first die, where the conductive feature is electrically coupled to an input/output (IO) pad of the first die, the IO pad underlying the second die, where the conductive pillar is electrically coupled to the conductive feature. In an embodiment, the semiconductor package further includes a second redistribution structure over the second die, the conductive pillar, and the molding material, the second redistribution structure electrically coupled to the second die and the conductive pillar. In an embodiment, the semiconductor package further includes a third die laterally adjacent to the first die, where the second die overlies the first die and the third die. In an embodiment, the semiconductor package further includes a dielectric film between the second die and the first die and between the second die and the third die.

In an embodiment, a method of forming a semiconductor device includes forming a first redistribution structure over a first side of a first die; forming a conductive pillar over and electrically coupled to the first redistribution structure; attaching a second side of the first die opposing the first side to a carrier; attaching a second die to the first redistribution structure, where after attaching the second die, a portion of the second die extends beyond lateral extents of the first die; and forming a molding material over the carrier and around the first die, the second die, the first redistribution structure and the conductive pillar. In an embodiment, the method further includes, before attaching the second die, attaching a third die to the carrier adjacent to the first die, where attaching the second die includes attaching the second die to the first redistribution structure and the third die. In an embodiment, forming the first redistribution structure includes forming a first dielectric layer over the first side of the first die; and forming a conductive layer over the first dielectric layer, where attaching the second die includes attaching the second die to the conductive layer using an adhesive layer, where the adhesive layer contacts the conductive layer of the first redistribution structure. In an embodiment, the method further includes forming a second redistribution structure over the molding material, the second redistribution structure electrically coupled to the second die and the conductive pillar; and forming conductive bumps over and electrically coupled to the second redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a first die, wherein the first die has a die connector and a conductive trace electrically coupled to the die connector, an upper surface of the conductive trace being level with an upper surface of the die connector;
   a second die attached to the first die, a first portion of the first die extending beyond a lateral extent of the second die;
   a conductive pillar over the first portion of the first die and laterally adjacent to the second die, the conductive pillar electrically coupled to the conductive trace of the first die;
   a dielectric layer between the conductive trace and the second die, the conductive pillar extending through the dielectric layer to electrically couple with the conductive trace of the first die;
   a molding material around the first die, the second die, and the conductive pillar; and
   a first redistribution structure over the molding material, the first redistribution structure electrically coupled to the conductive pillar and the second die.

2. The semiconductor package of claim 1, further comprising a third die laterally adjacent to the first die and underlying the second die.

3. The semiconductor package of claim 2, wherein the third die is a dummy die.

4. The semiconductor package of claim 1, wherein the molding material comprises:
   a first molding material below the dielectric layer and around the first die; and
   a second molding material above the dielectric layer and around the second die and the conductive pillar.

5. A semiconductor package comprising:
   a first die;
   a second die over the first die;
   a first redistribution structure between the first die and the second die, the first redistribution structure electrically coupled to the first die, a first width of the first redistribution structure measured between opposing sidewalls of the first redistribution structure is equal to a second width of the first die measured between opposing sidewalls of the first die;
   a conductive pillar over and electrically coupled to the first redistribution structure; and
   a molding material around the first die, the second die, the first redistribution structure, and the conductive pillar, wherein the molding material comprises a same material that extends continuously from a lower surface of the first die facing away from the second die to an upper surface of the conductive pillar distal from the first die,
   wherein a first portion of the first die underlies the second die, and a second portion of the first die underlies a portion of the molding material.

6. The semiconductor package of claim 5, wherein a pad region of the first redistribution structure is disposed over the second portion of the first die, wherein the pad region is electrically coupled to an input/output (IO) pad of the first die, the IO pad disposed in the first portion of the first die and disposed between the first die and the second die, wherein the conductive pillar is directly over and electrically coupled to the pad region.

7. The semiconductor package of claim 5, further comprising a second redistribution structure over the second die, the conductive pillar, and the molding material, the second redistribution structure electrically coupled to the second die and the conductive pillar.

8. The semiconductor package of claim 5, further comprising a third die laterally adjacent to the first die, wherein the second die overlies the first die and the third die.

9. The semiconductor package of claim 8, further comprising a dielectric film between the second die and the first die and between the second die and the third die.

10. The semiconductor package of claim 6, wherein the pad region is electrically coupled to the IO pad by a conductive line of the first redistribution structure, wherein the conductive line extends along a major upper surface of the first die.

11. The semiconductor package of claim 8, wherein a lower surface of the third die facing away from the second die is level with a lower surface of the first die facing away from the second die.

12. The semiconductor package of claim 11, wherein the third die is a dummy die.

13. The semiconductor package of claim 9, wherein an uppermost layer of the first redistribution structure comprises an electrically conductive feature, wherein the dielectric film physically contacts the electrically conductive feature.

14. A semiconductor package comprising:
   a first die;
   a first redistribution structure on a first side of the first die;
   a conductive pillar over and electrically coupled to the first redistribution structure;
   a second die laterally adjacent to the conductive pillar and attached to the first redistribution structure, wherein a portion of the second die extends beyond lateral extents of the first die; and
   a molding material around the first die, the second die, the first redistribution structure and the conductive pillar, wherein the molding material extends continuously from a second side of the first die facing away from the second die to a surface of the conductive pillar distal from the first die.

15. The semiconductor package of claim 14, further comprising, a third die laterally adjacent to the first die, wherein the second die is attached to the first redistribution structure and to the third die.

16. The semiconductor package of claim 14, wherein the first redistribution structure comprises:
   a first dielectric layer on the first side of the first die; and
   a conductive layer on the first dielectric layer, wherein the conductive layer comprises:
      a conductive via extending through the first dielectric layer and electrically coupled to an input/output (IO) pad of the first die; and
      a conductive line extending along an upper surfaced of the first dielectric layer and electrically coupled to the conductive via, wherein the conductive layer is an uppermost layer of the first redistribution structure.

17. The semiconductor package of claim 14, further comprising:
a second redistribution structure over the molding material, the second redistribution structure electrically coupled to the second die and the conductive pillar; and
conductive bumps over and electrically coupled to the second redistribution structure.

18. The semiconductor package of claim 15, wherein the third die is disposed within lateral extents of the second die.

19. The semiconductor package of claim 18, wherein a third side of the third die facing away from the second die is coplanar with the second side of the first die.

20. The semiconductor package of claim 16, wherein the conductive via is disposed between the first die and the second die, wherein a first portion of the conductive line extends beyond lateral extents of the second die, wherein the conductive pillar is directly over and electrically coupled to the first portion of the conductive line.

\* \* \* \* \*